US008674460B2

United States Patent
Gutierrez et al.

(10) Patent No.: US 8,674,460 B2
(45) Date of Patent: Mar. 18, 2014

(54) MECHANICAL ISOLATION FOR MEMS ELECTRICAL CONTACTS

(75) Inventors: Roman C. Gutierrez, Arcadia, CA (US); Robert J. Calvet, Pasadena, CA (US)

(73) Assignee: DigitalOptics Corporation MEMS, Arcadia, CA (US)

( * ) Notice: Subject to any disclaimer, the term of this patent is extended or adjusted under 35 U.S.C. 154(b) by 416 days.

(21) Appl. No.: 12/790,646

(22) Filed: May 28, 2010

(65) Prior Publication Data

US 2010/0308431 A1 Dec. 9, 2010

Related U.S. Application Data

(60) Provisional application No. 61/182,292, filed on May 29, 2009.

(51) Int. Cl.
  *H01L 27/14* (2006.01)
  *H01L 29/82* (2006.01)
  *H01L 29/84* (2006.01)

(52) U.S. Cl.
  USPC .............. 257/414; 257/420; 257/E23.151

(58) Field of Classification Search
  USPC ............. 257/414, 420, E23.151; 438/52
  See application file for complete search history.

(56) References Cited

U.S. PATENT DOCUMENTS

| | | | | |
|---|---|---|---|---|
| 5,086,337 A * | 2/1992 | Noro et al. | ................... | 257/726 |
| 5,583,373 A * | 12/1996 | Ball et al. | ................... | 257/678 |
| 5,717,631 A | 2/1998 | Carley et al. | | |
| 5,915,678 A * | 6/1999 | Slocum et al. | ................ | 269/47 |
| 6,275,324 B1 * | 8/2001 | Sneh | ........................... | 359/291 |
| 6,360,035 B1 * | 3/2002 | Hurst et al. | .................... | 385/18 |
| 6,661,995 B2 | 12/2003 | Isobe | | |
| 6,674,585 B1 * | 1/2004 | Calvet et al. | ................ | 359/822 |
| 6,722,197 B2 * | 4/2004 | Knowles et al. | ........... | 73/504.12 |
| 7,477,842 B2 | 1/2009 | Gutierrez | | |
| 7,699,296 B1 * | 4/2010 | Knollenberg et al. | ........ | 267/160 |
| 2002/0011759 A1 * | 1/2002 | Adams et al. | ................ | 310/309 |
| 2004/0147056 A1 * | 7/2004 | McKinnell et al. | ............ | 438/52 |
| 2004/0207744 A1 * | 10/2004 | Bock | ............................ | 348/335 |
| 2005/0160816 A1 * | 7/2005 | Yu | ............................. | 73/514.29 |
| 2005/0183503 A1 * | 8/2005 | Malametz | ................. | 73/514.01 |
| 2006/0119217 A1 * | 6/2006 | Yang | ............................. | 310/309 |
| 2010/0251817 A1 * | 10/2010 | Ge et al. | ..................... | 73/504.12 |
| 2010/0300201 A1 * | 12/2010 | Ge et al. | ..................... | 73/504.12 |

OTHER PUBLICATIONS

Invitation to Pay Additional Fees with Partial International Search Report dated May 6, 2011.

* cited by examiner

*Primary Examiner* — Hoai V Pham
(74) *Attorney, Agent, or Firm* — Haynes and Boone, LLP

(57) ABSTRACT

In accordance with the disclosure, a MEMS substrate is provided that includes: a central planar portion configured to support a MEMS device; and a first electrical pad coplanar with the central planar portion, the first pad being connected to the central planar portion through a first flexure, wherein the first flexure is configured to substantially mechanically isolate the first electrical pad from the central planar portion.

16 Claims, 8 Drawing Sheets

MECHANICAL ISOLATION FOR MEMS ELECTRICAL CONTACTS

PRIORITY CLAIM

This patent application claims the benefit of U.S. Provisional Patent Application No. 61/182,292, filed on May 29, 2009. The entire contents of this provisional patent application are hereby expressly incorporated by reference.

TECHNICAL FIELD

The present disclosure relates generally to microelectromechanical systems (MEMS). The present disclosure relates more particularly to methods and systems for mechanical isolation of MEMS electrical contacts.

BACKGROUND

MEMS combine miniaturized mechanical and electrical devices to make correspondingly small machines. MEMS fabrication builds upon and exploits the massive development that has taken place in semiconductor manufacturing processes with regard to integrated circuit technology. Thus, despite the difficulties presented by forming such miniature machines with precision tolerances, MEMS devices can be manufactured relatively economically on a mass scale.

A growing application of MEMS technology is in miniature cameras for applications such as cell phones. Initially, cell phone cameras were typically fairly crude affairs such a fixed focus plastic lens assembly. Better optical fidelity was unnecessary since the resolution of the associated image sensor was relatively poor. However, it now commonplace for cell phone cameras to have high-resolution (multiple-megapixel) imaging sensors. To exploit the image fidelity achievable with such pixel resolution, MEMS camera modules that provide autofocus modules and auto-shutter capabilities have been developed. High-fidelity optics require considerable precision with regard to alignment of lens and other elements in the light path that is readily achieved by MEMS developments such as disclosed in commonly-assigned U.S. Pat. No. 7,477,842, the contents of which are incorporated by reference.

MEMS devices such as camera modules are typically mounted onto some sort of substrate or base. But as discussed above, optical modules require considerable precision in their construction. This precision alignment may be adversely affected if strain from the MEMS mount couples into the MEMS device itself. For example, a common base substrate is plastic, which has a different thermal coefficient of expansion as compared to the semiconductor such as silicon used to form the MEMS device. Thermal changes can thus introduce strain between the MEMS device and its mounting substrate.

Another source of strain for MEMS devices stems from the electrical contact technique used to couple an electrical power source to the MEMS device. For example, a MEMS camera module may include an electrostatic actuator for actuating the focusing lens or other components that requires an electric power source. In that regard, it is conventional to use wire bonding or other techniques to couple to the MEMS electrical contacts. The wires can then mechanically stress the MEMS device.

Accordingly, there is a need in the art for MEMS devices with electrical contacts that isolate the MEMS devices from mechanical stress.

SUMMARY

In accordance with a first aspect of the disclosure, a device is provided that includes: a semiconductor substrate; and flexures that are configured to substantially isolate the substrate from mechanical stress caused by electrical contact therewith.

In accordance with a second aspect of the disclosure, a MEMS substrate is provided that includes: a central planar portion configured to support a MEMS device; and a first electrical pad coplanar with the central planar portion, the first pad being connected to the central planar portion through a first flexure, wherein the first flexure is configured to substantially mechanically isolate the first electrical pad from the central planar portion.

In accordance with a third aspect of the disclosure, a MEMS device is provided that includes: a mounting substrate having a planar surface and including a plurality of base mounts that project from the planar surface; and a planar MEMS substrate including a central portion and a plurality of mounts, each mount being isolated from the central portion through a plurality of corresponding mount flexures, each mount configured to engage with a corresponding one of the base mounts, the planar MEMS substrate further including a plurality of electrical pads, each pad being isolated from the central portion through a corresponding pad flexure.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figures 1A, 1B:
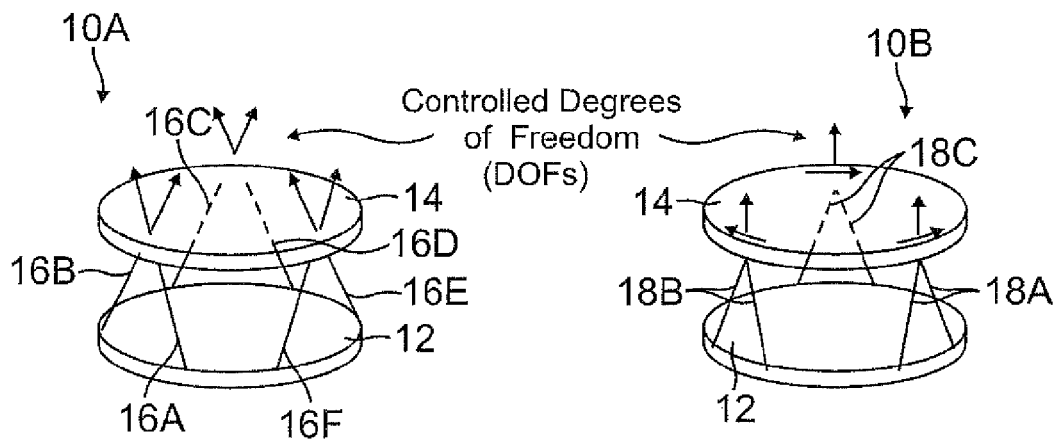
FIG. 1A is a perspective view of an exemplary embodiment of a kinematic support configuration in accordance with the present invention.
FIG. 1B is a perspective view of another exemplary kinematic support configuration.

Mounting a MEMS device on a relatively stiff plastic lowers manufacturing costs while providing a sturdy mounting substrate. But the thermal coefficients of expansion for the mounting substrate and the MEMS device may then differ. Accordingly, thermal changes will cause the mounting substrate to expand or contract at a different rate as compared to the mounted MEMS device. The differences in expansion and contraction between the two structures can then stress the MEMS device. Such stress can be aggravated by wire bonds to the MEMS device's electrical contacts. MEMS devices are disclosed herein that alleviate both sources of stress. The disclosed MEMS devices connect to the mounting substrate through thermal compensation flexure assemblies to isolate any mechanical strain in the mounting substrate. As will be explained further herein, soft-flexure electrical contacts further isolate the MEMS device from mechanical stress.

Commonly-assigned U.S. Pat. No. 6,674,585, the contents of which are incorporated by reference, discloses suitable thermal compensation flexure assemblies. The flexure assemblies allow a user to position the MEMS device with regard to the mounting substrate. In that regard, the location of any point on an object is defined by a suitable reference coordinate system such as the familiar x, y, and z Cartesian coordinate system. The attitude of the object then corresponds to three orthogonal rotations with respect to the reference coordinate system—for example, the object attitude can be defined using yaw, pitch, and roll angles. The thermal compensation flexures disclosed herein permit a user to precisely define the location and attitude of the MEMS device with respect to the mounting substrate.

The location and attitude of an object defines six degrees of freedom. For example, an object can translate in the x-direction, which corresponds to one degree of freedom (DOF). Translations in the y-direction and z-direction correspond to two other degrees of freedom (DOFs). Roll, pitch, and yaw movements may define the three remaining DOFs.

A 6-DOF-defined mounting of a MEMS device to a mounting substrate is thus defining the location and attitude of the MEMS device with respect to the mounting substrate. If the MEMS device is to be stationary in location and attitude, the mounting should be rigid or stiff in each one of the six DOFs. But additional degrees of freedom can also be defined for objects. For example, robotic arms will commonly have twenty of more degrees of freedom in their movements. Thus, a MEMS mounting may be rigid in more than six degrees of freedom. As defined herein, a "pseudo-kinematic" mounting is one that is stiff in only six degrees of freedom but possesses other softer, relatively less stiff degrees of freedom. For example, the soft degrees of freedom for a pseudo-kinematic mounting may be two to three orders of magnitude less stiff than its more rigid six DOFs.

A pseudo-kinematic mounting may be modified to be stiff in less than six DOFs such that it provides degenerate support. For example, a MEMS actuating stage (such as for moving a focusing lens) can be mounted to a base through a mounting that is stiff in only five degrees of freedom. In this fashion, the actuating stage is free to move in, for example, the x-direction for focusing purposes. But such mountings would typically be internal to the MEMS device in that the MEMS device itself is generally mounted rigidly in six DOFs with respect to its mounting substrate. Thus, the remaining discussion will focus on six-DOF pseudo-kinematic mountings without loss of generality.

Pseudo-kinematic mounts may be better understood with reference to a kinematic mounting.

Kinematic Mounting

A kinematic mounting constrains six DOFs only. Turning now to the drawings, FIG. 1A is a three-dimensional schematic view of a kinematic support configuration 10A. The kinematic support configuration 10A of FIG. 1A comprises a base assembly 12, a payload assembly 14 and six monopod connecting elements 16A-16F (individually or collectively referred to herein as monopod connecting elements 16"). In one configuration, the base assembly 12 comprises a base support structure, and the payload assembly 14 holds or aligns an optical element, such as an optical fiber, lens or mirror. The base assembly 12 is connected to the payload assembly 14 via the six monopod connecting elements 16A-16F.

Each monopod connecting element 16 of FIG. 1A constrains one degree of freedom between the base assembly 12 and the payload assembly 14, as shown by an arrow above the kinematic support configuration 10A of FIG. 1A. A constrained DOF may be referred to as a 'stiff' DOF or a restrained DOF. The relevant reference parameter for translational stiffness or translational DOF is force, while the relevant reference parameter for rotational stiffness or rotational DOF is torque.

FIG. 1B is a three-dimensional schematic view of another kinematic support configuration 10B. The kinematic support configuration 10B of FIG. 1B comprises a base assembly 12, a payload assembly 14 and three bipod connecting elements 18A-18C (individually or collectively referred to herein as "bipod connecting element 18"). The base assembly 12 is connected to the payload assembly 14 via the three bipod connecting elements 18A-18C. Each bipod connecting element 18 constrains two DOFs between the base assembly 12 and the payload assembly 14, as shown by a pair of arrows near the kinematic support configuration 10B of FIG. 1B. In one embodiment, the kinematic support configurations 10A, 10B each have a structural path between the base assembly 12 and the payload assembly 14 in six independent DOFs, as shown by the arrows in FIGS. 1A, 1B. Six DOFs of constraint may be desired for some optic alignment applications.

The respective kinematic support configurations 10A, 10B of FIGS. 1A and 1B have the advantage of being as stiff as the respective connecting elements 16A-16F, 18A-18C, but any strain or distortion in the base assembly 12 will not be transferred to the payload assembly 14 (although a positional or attitude change may occur). Thus, any sensitive optical elements aligned within the payload assembly 14 will not be affected if applied loads or bulk temperature changes deform the base assembly 12.

Similarly, if the payload 14 grows or shrinks, there will be no forces transferred to the base assembly 12 because of the connecting elements 16A-16F, 18A-18C. But there may be a change in position or attitude between the base 12 and the payload 14. For the symmetric support configurations shown in FIGS. 1A and 1B, the only change is in the vertical direction between the two bodies 12, 14. The payload 14 may be rigidly supported and maintains position in the presence of environmental conditions, such as inertial loads.

If there are more than six DOFs constrained between the base 12 and payload 14, and the base 12 distorts or warps, there will be no solution of payload position and attitude that does not also warp the payload 14. This type of support may be called "redundant."

In some cases for both degenerate and redundant support, two or more connecting elements may constrain the same DOF. This may occur when certain connecting elements 16, 18 are constraining the payload 14 in the same way, such that removal of one of these connecting elements would not substantially affect the static position of the payload 14 with respect to the base 12. In this case, the support is said to have a "redundant DOF".

Figures 2A, 2B:
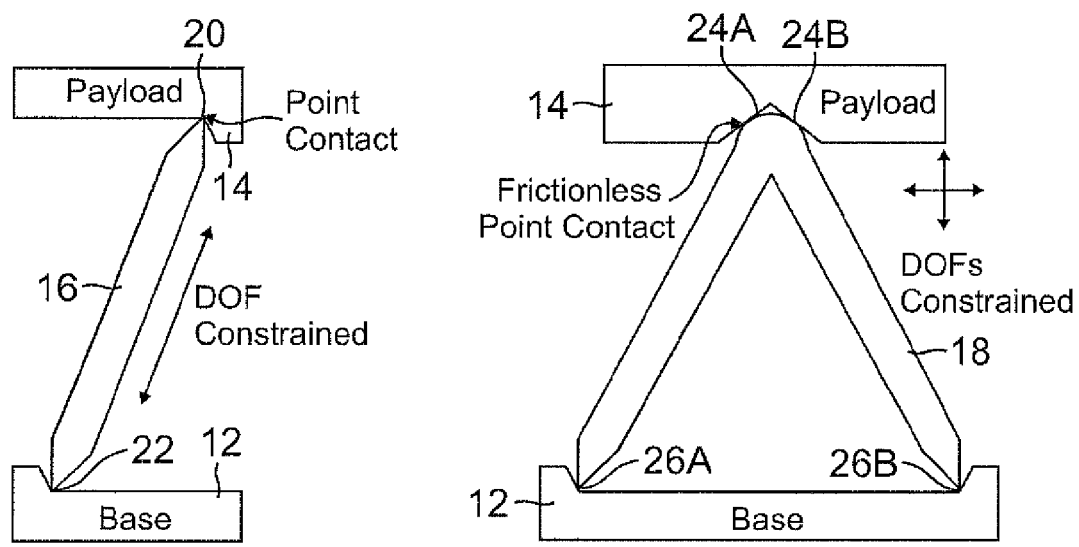
FIG. 2A is an elevation view of a monopod connecting element of the kinematic support configuration of FIG. 1A.
FIG. 2B is an elevation view of a bipod connecting element of the kinematic support configuration of FIG. 1B.

FIG. 2A is a partial elevation view of the monopod connecting element 16 shown in FIG. 1A. The monopod connecting element 16 of FIG. 2A constrains the base and payload assemblies 12, 14 with point contacts 20, 22 at two ends.

FIG. 2B is partial elevation view of the bipod connecting element 18 of FIG. 1B. The bipod connecting element 18 of FIG. 2B constrains the base and payload assemblies 12, 14 with one or more (ideally) frictionless point contacts 24A, 24B at one end, and two point-contacts 26A, 26B at the other end.

The DOFs restrained by the respective monopod and bipod connecting elements 16, 18 are indicated by arrows in FIGS. 2A and 2B. Six monopod connecting elements 16A-16F may constrain six DOFs between the base and payload assemblies 12, 14, as shown by the arrows in FIG. 1A. Also, three bipod connecting elements 18A-18C may constrain six different DOFs between the base and payload assemblies 12, 14, as shown by the arrows in FIG. 1B.

Both types of joints (i.e., the point-in-groove joint of FIG. 2A and the circle-in-groove joint of FIG. 2B) may be used interchangeably. A preload may be used to maintain contact between the base 12, connecting element 16 or 18, and payload 14 of FIGS. 2A and 2B. Having discussed kinematic mounts, the adaptation of such mounts into pseudo-kinematic mounts will now be addressed.

Figure 3:
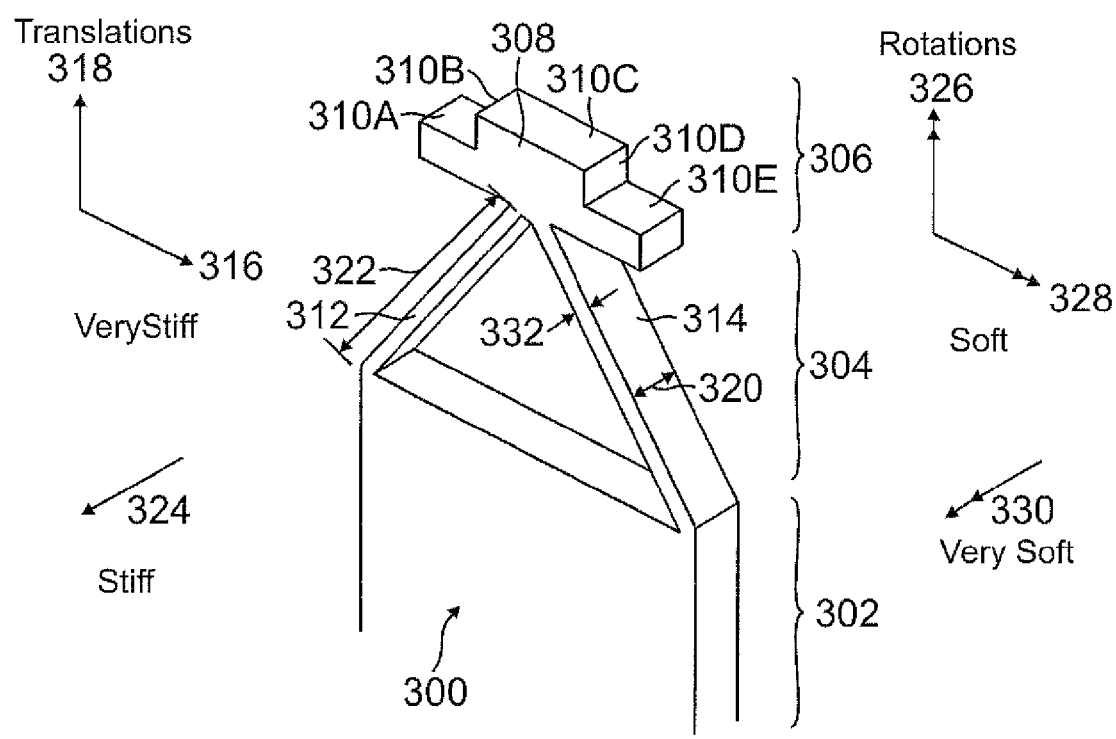
FIG. 3 is a partial perspective view of an exemplary embodiment of a stiffness control flexure system and attachment portion in accordance with the present invention.

Pseudo-Kinematic Connecting Element, Flexure Systems, Ball Joints, Attachment Points FIG. 3 is a partial perspective view of one embodiment of a pseudo-kinematic connecting element flexure system and an attachment point 300. In some applications, it is desirable to have at least one DOF with low stiffness to be two to three orders of magnitude lower than a DOF with high stiffness. DOFs with different levels of stiffness may be accomplished using a flexure system, such as the flexure system 300 of FIG. 3, to relieve stiffness in unwanted DOFs.

In FIG. 3, the pseudo-kinematic connecting element flexure system and attachment point 300 comprises a body 302, a flexure system 304, and an attachment portion 306. The flexure system 304 couples the body 302 to the attachment portion 306. The attachment portion 306 and the flexure system 304 may be collectively referred to herein as a "ball joint," a "ball joint flexure" or a "flexured ball joint" in a planar structure. A ball joint is a useful pseudo-kinematic structure that is relatively stiff in substantially all translations and relatively soft in substantially all rotations.

One embodiment of the attachment portion 306 of FIG. 3 comprises a mounting tab 308 with mating surfaces (contact surfaces) 310A, 310B, 310D, 310E, which may provide high precision dimensional control to mating elements. The flexure system 304 comprises two flexure elements 312, 314 that form a bipod-like structure. Each flexure element 312, 314 is very stiff in at least an axial direction. Thus, each flexure element 312, 314 provides a very stiff connection between the attachment portion 306 and the body 302 in DOFs 316 and 318, as shown in FIG. 3.

Depending on the cross-sectional properties of the flexure system, the connecting elements may have compliant (or "soft") rotations become stiff and stiff translations become soft. The cross-sectional properties of the flexure elements 312, 314 include blade depth 320, blade length 322, and blade thickness 332. If the blade depth 320 of the flexure elements 312, 314 is significantly smaller (e.g., less than 1/10) than the blade length 322, the attachment of the body 302 to the attachment portion 306 by the flexure elements 312, 314 may have two stiff DOFs 316, 318 (i.e., forming a bipod), and other relatively softer DOFs 324, 326, 328, 330. Six such bipods would thus comprise a pseudo-kinematic mounting.

In other applications, if the flexure elements 312 and 314 have a blade depth 320 that is significant (e.g., greater than about 1/10 of the blade length 322), then DOF 324 has significant stiffness, and the attachment has the properties of a ball joint. The rotational DOFs 326, 328 may become stiffer compared to DOF 330, which is primarily controlled by the flexure blade width 332. In one embodiment, DOFs 326, 328 are soft and DOF 330 is very soft compared to DOFs 316, 318.

The stiffness of the DOFs is highly dependent on the exact cross-sectional properties (blade depth 320, length 322, and thickness 332) of the flexure elements 312, 314. The "soft" rotational DOFs 326, 328 may be readily made stiffer and the "stiff" translation 324 made softer by changing the cross-sectional properties. As long as the blade length 322 is much greater than the blade depth 320 and the blade thickness 332, e.g., a 10 to 1 ratio (other ratios may be used), the "very stiff" translations 316 and 318 and the "very soft" rotation 330 will remain unchanged for this configuration.

In one configuration, it is desirable to have a ball joint at both ends of the body 302 to form a monopod connecting element (not illustrated). This configuration would create an appropriate set of stiff DOFs to make the monopod connecting element act like a single DOF constraint between two bodies. Six such monopods would thus comprise a pseudo-kinematic mounting.

Design/Fabrication Considerations for Pseudo-Kinematic Connecting Elements

Since the alignment features of the connecting element 300 discussed above are all coplanar lines, a mask with the desired pattern can be made for the patterning process (e.g., lithography). The patterning process can locate alignment features with high precision in a substrate wafer plane immediately adjacent to the mask.

In some applications, it may be important to consider two design and fabrication points for the connecting element 300 of FIG. 3. First, the mask sides or regions of a substrate wafer intended to form mating features should be substantially in contact with the mask sides of other elements for highest precision. For example, for highest precision, the mask sides of the feature should be the upper surface of the base assembly (e.g., 12 of FIGS. 1A, 1B) and a lower surface of the payload assembly (e.g., 14 of FIGS. 1A, 1B).

Second, a micromachining process may either etch (cut) through the substrate wafer in a perfectly perpendicular manner or with a draft (e.g., inward draft). Etching the substrate in a perfectly perpendicular manner is the ideal case. If drafting occurs, it is recommended to have an inward draft with acute angles measured from the mask plane to the etched sides of the substrate wafer. It may be important to ensure contact at the masked side of the substrate wafer. In one embodiment, the amount of draft should be as small as practical, such as just enough draft to ensure there is nothing beyond a perpendicular cut (outward draft; obtuse angle) within the error of the micromachining process. For example, in one configuration, the draft is half a degree.

As a result of inward drafts, some of the ideal line contacts may be reduced to point contacts with very shallow angles. The mating surfaces for the base assembly, the payload assembly and the connecting element 300 may all experience drafts. Thus, the respective mating surfaces of the features (which define lateral position reference line segments) may actually be contact points on the mask sides of the base assembly and the payload assembly. Inward drafting may be acceptable because the two planes of two mating surfaces, which coincide at a point contact, form a very acute angle. Thus, if a load is applied, a substantial contact path may be formed, and hence, result in reasonable contact stresses. Having discussed pseudo-kinematic mounts in general, a particularly advantageous pseudo-kinematic mount embodiment will now be addressed.

Coplanar Pseudo-Kinematic Mounts

Figure 4:
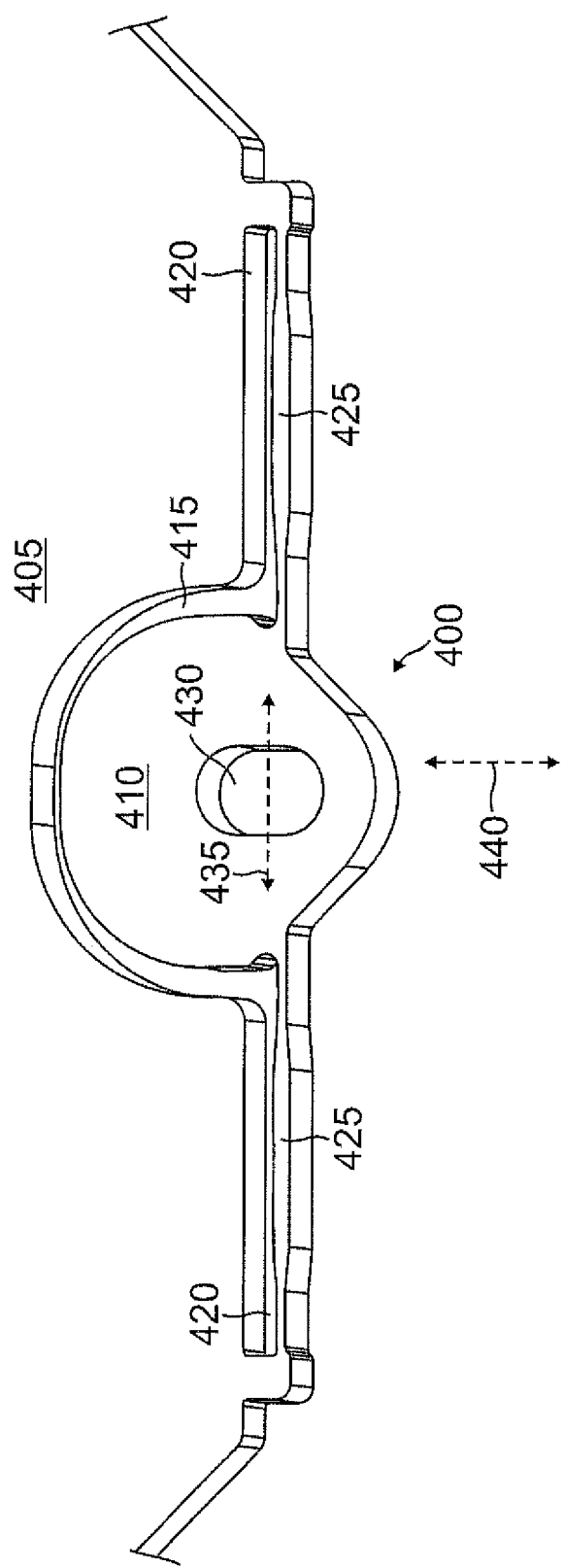
FIG. 4 is a perspective view of a pseudo-kinematic mount that is coplanar with and formed in a MEMS substrate.

An example pseudo-kinematic mount 400 is shown in FIG. 4 that is coplanar and formed from the same semiconductor wafer used to form MEMS substrate 405. For example, a monolithic wafer may be micro-machined to form both MEMS substrate 405 and mount 400. Within mount 400, a central island 410 is separated from substrate 405 by an annular gap 415 that also extends tangentially from island 410 to form elongated slots 420. Island 410 connects to substrate 405 through tangentially-extending flexures 425. Island 410 includes a tab opening 430 that may be radially oriented towards substrate 405. Flexures 425 may have the cross-sectional properties discussed above with regard to blades 312 and 314 of FIG. 3. Thus, if a base mount tab (discussed further below) for a mounting substrate (also discussed further below) engages tab opening 430, a resulting tangential degree of freedom 435 for such a MEMS substrate/mounting substrate connection is constrained relatively stiffly. Note that strains from thermal expansion or contraction of a mounting substrate will typically be radially directed. Such strains are readily accommodated by a relatively soft radial DOF 440 for mount 400 achieved by movement of flexures 425. In other words, a radially-strained mounting substrate can in turn induce a radial strain in island 410 that is not coupled into MEMS substrate 405 because of relatively soft radial DOF 440. Yet as further explained below, mount 400 provides two relatively stiff DOFs: tangential DOF 430 as well as a z-directed DOF that is normal to the plane of both the mounting substrate and substrate 405. Thus, if MEMS substrate 405 includes three mounts 400, it will be held securely in six DOFs yet be isolated from any mechanical strain in the mounting substrate.

Figure 5:
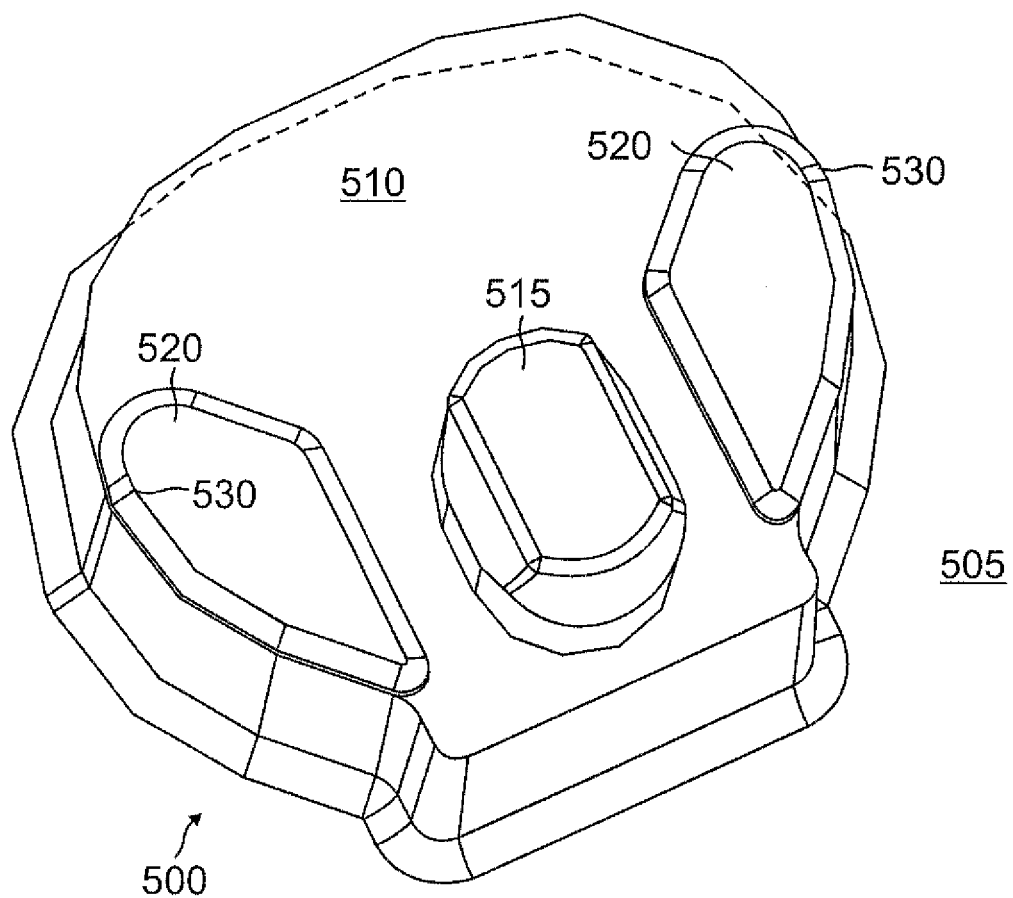
FIG. 5 is a perspective view of a pseudo-kinematic base mount configured to engage with the mount of FIG. 4.

FIG. 5 shows a mount base 500 on mounting substrate 505. Substrate 505 may comprise a stiff plastic that is readily precision molded to form the appropriate features. Mount base 500 includes a raised mesa 510 having lateral dimensions substantially matching similar lateral dimensions for central island 410 of FIG. 4. Projecting from mesa 510 is a radially-oriented tab 515. Two wedges 520 also project from mesa 510 on either side of tab 515. In one embodiment, wedges 520 tangentially slope towards tab 515 such that an outer edge 530 for each wedge forms the greatest displacement from the planar surface of mounting substrate 505. Referring back to FIG. 4, it may be seen that tab 515 will form a relatively tight fit when engaging tab opening 430. Thus, the location of tab 515 on mounting substrate 505 defines a resulting position of MEMS substrate 405 with regard to such a tab location. Similarly, wedges 530 define a resulting z-directed (height) displacement of MEMS substrate 405 from the planar surface of substrate 505. In one embodiment, the z-directed displacement of MEMS substrate 405 from mounting substrate 505 is 50 μm. In general, the amount of displacement will depend upon a particular design specification. MEMS mount 400 and mount base 505 result in a MEMS/mounting substrate connection having two relatively-stiff DOFs yet flexures 425 keep this connection relatively soft in other DOFs.

Figure 6:
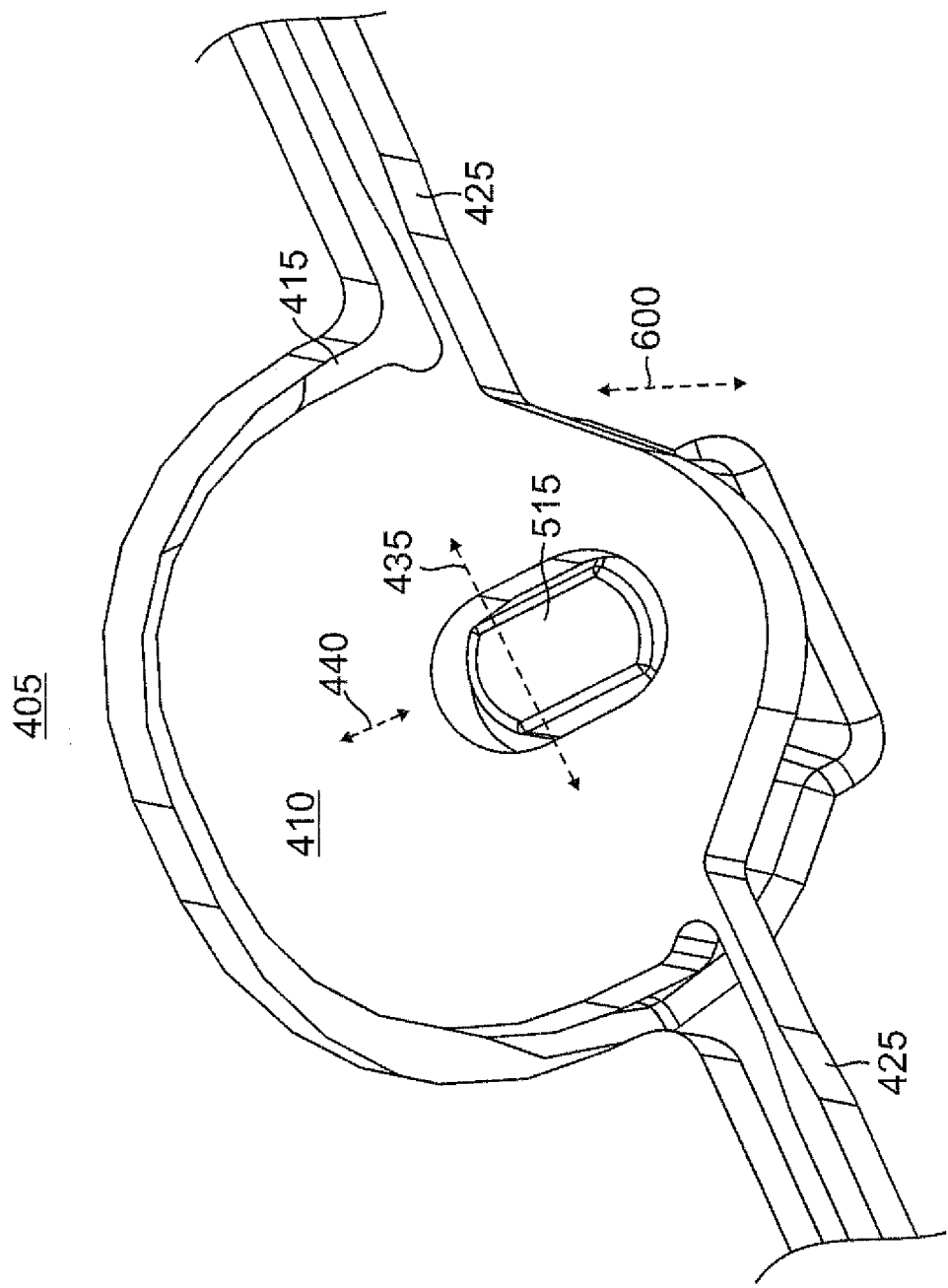
FIG. 6 is a perspective view of the base mount of FIG. 5 engaged with the mount of FIG. 4.

FIG. 6 shows tab 515 engaged in tab opening 430. An undersurface for island 410 is supported by wedges 520 as discussed with regard to FIG. 5. The pseudo-kinematic connection is thus relatively stiff in two DOFs (a z-directed DOF 600 and also tangential DOF 435) but can accommodate strain through relatively soft DOFs such as radial DOF 440. Prior to engaging the mount with mount base, one or more of these components may be coated with a suitable adhesive to secure the friction-fitted pieces together. It will thus be appreciated that a MEMS substrate and any associated module formed on the MEMS substrate may be readily engaged onto the base mounts on a mounting substrate through a robotic placement.

Electrical Contact Flexures

As discussed above, a MEMS device's substrate may be advantageously secured in 6 DOFs with regard to a mounting substrate but be isolated from mechanical stress through a pseudo-kinematic mounting by adapting a kinematic mount with appropriate monolithic flexures. However, if the MEMS device is then wire bonded on its electrical contacts, such advantageous stress relief may be diminished or even destroyed by mechanical stress at the bonded MEMS contacts. Other conventional methods of coupling a power source to the MEMS device's electrical contacts may also introduce mechanical stress on the MEMS device, thereby potentially destroying optical alignments or other precise tolerances provided by the device.

Figure 7:
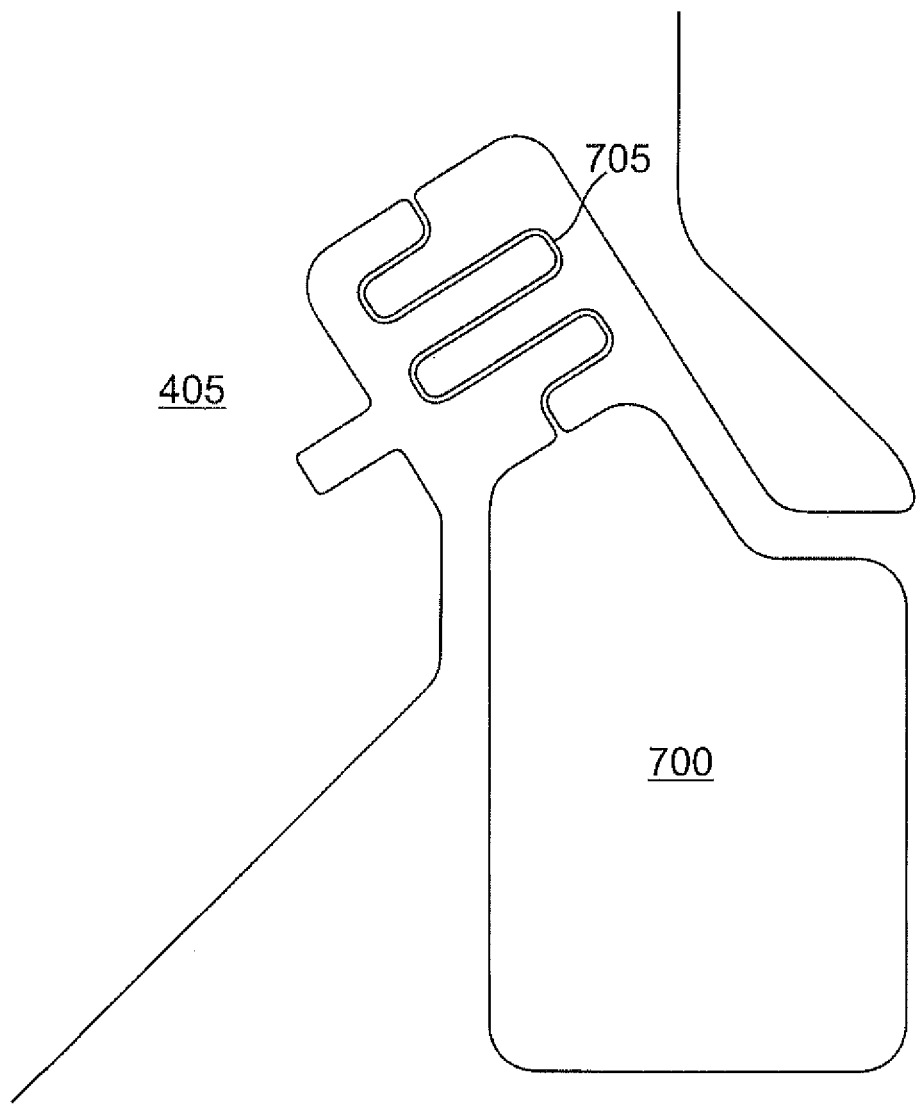
FIG. 7 is a plan view of a soft-flexure electrical pad for a MEMS substrate.
Figure 8:
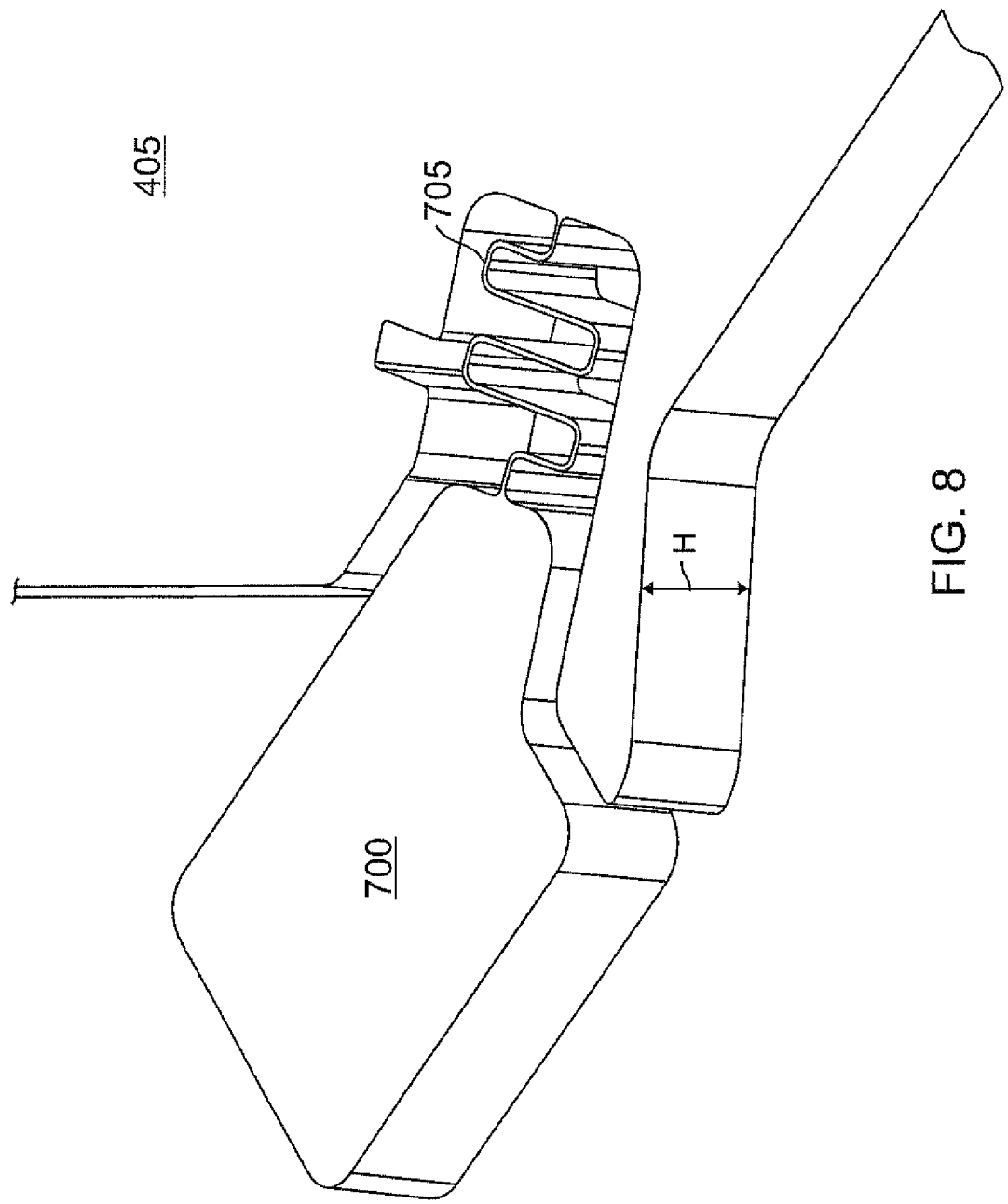
FIG. 8 is a perspective view of the pad of FIG. 7.
Figure 9:
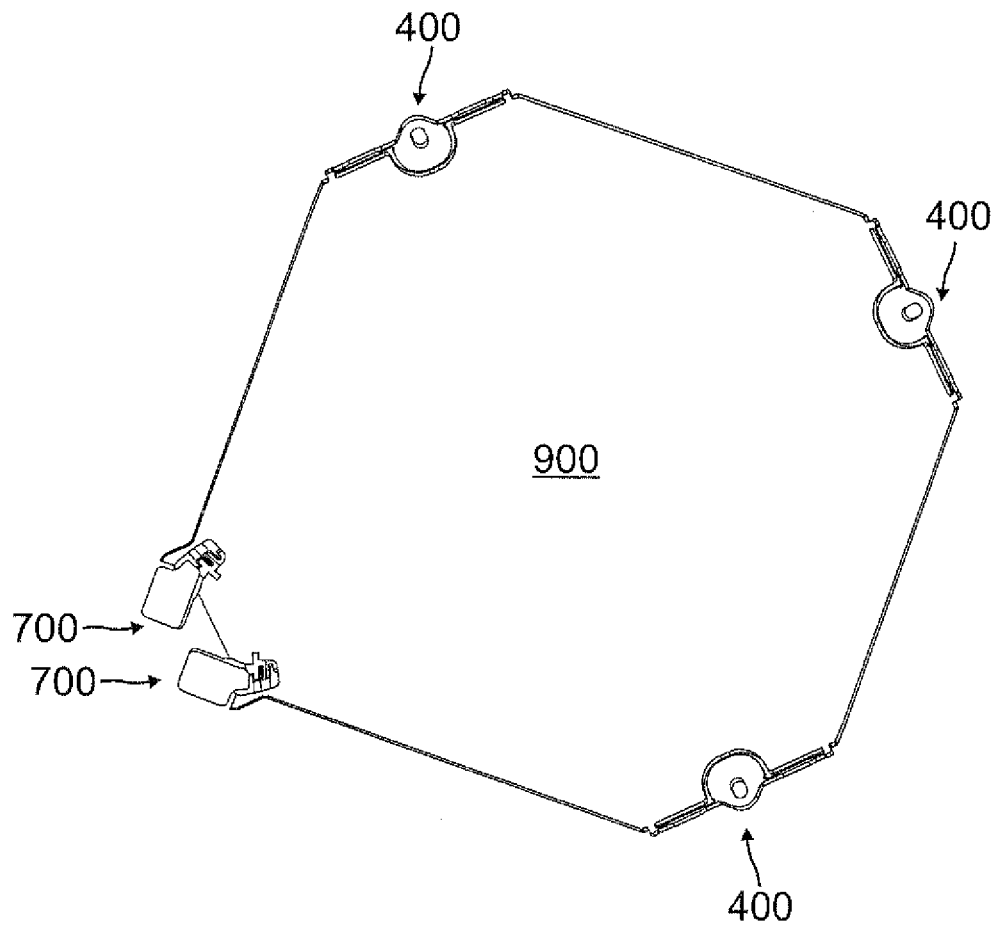
FIG. 9 is a plan view of a MEMS substrate configured with pseudo-kinematic mounts and soft-flexure electrical pads.

An electrical contact pad 700 as illustrated in FIGS. 7 and 8 alleviates such mechanical stress. Pad 700 is isolated from MEMS substrate by a relatively soft flexure 705. For example, flexure may comprise a corrugated and relatively very thin sheet of substrate material. For example, if substrate has a height of H (FIG. 8), the width may be less than H/10 or even substantially less. In this fashion, the resulting corrugated sheet of substrate material used to form flexure 705 is quite soft in all DOFs. Pad 700 may then be metalized and electrically coupled to a suitable connector using conventional techniques such as wire bonding. This is quite advantageous because the resulting electrical contact is very economical to manufacture yet virtually eliminates any mechanical stress from the wire bonding to pad 700 from coupling to MEMS substrate 405. Moreover, the pad formation is still coplanar and monolithic with substrate 405 and thus does not require extra manufacturing steps. Indeed, since pseudo-kinematic mounts 400 are also coplanar and monolithic with substrate 405, a MEMS substrate is readily manufactured with both pads 700 and mounts 400. In addition, no part-way etching to thin the depth of associated flexures 705 and 425 is necessary in that the depth for these flexures matches the height H for the MEMS substrate. It will be appreciated, however, that part-way etching may be used on these flexures if desired. A resulting MEMS substrate 900 that includes two pads 700 and three mounts 400 is shown in FIG. 9.

Referring back to FIGS. 7 and 8, one can readily appreciate that if the etched substrate itself is used to conduct electrical current to the MEMS device through flexure 705, then only one pad 700 can be used in such a fashion. If both pads are configured to conduct through the substrate material forming their respective flexures, then they will simply short out to each other. Thus, one or both of the pads and respective flexures may be coated with oxide. In this fashion, a polysilicon or metal layer may be deposited on the oxide to conduct to MEMS actuators and circuitry within the resulting MEMS device. Alternatively, both flexures may be configured with a metal or polysilicon layer to conduct the desired electrical current. Regardless of whether a MEMS substrate is pseudo-kinematically mounted to a mounting substrate, the soft flexures such as discussed above may be used to mechanically isolate wire-bonded pads from the MEMS substrate. Micromachining techniques to form mounts 400 and pads 700 will now be discussed in more detail.

Micromachining

In general, the MEMS substrates discussed above may be manufactured using techniques such as lithography or photolithography to form a desired pattern on a substrate wafer that will eventually result in production of the desired features such as pads 700 and mounts 400. The substrate wafer may comprise silicon or another suitable material, such as gallium arsenide or germanium. The lithography process may include applying a resist on a surface of a substrate wafer, aligning a mask with a desired pattern above the substrate wafer, exposing the resist to radiation, developing the resist, and hardbaking the resist.

The radiation used for patterning the substrate wafer may include, by way of example, an ultraviolet light, an X-ray beam, or a beam of electrons. In one embodiment, the mask is made of a mechanically rigid material that has a low coefficient of thermal expansion. For example, the mask may be made of quartz, borosilicates, metallic chrome, or iron oxide. Patterning may be accomplished using either negative or positive resists. In some applications, it is desirable to use positive resists with aspect ratios above unity. In some applications, a photolithographic process is used to form a desired pattern on the substrate wafer. In a photolithography process, a photoresist such as photo-sensitive film is used in the patterning process.

After developing a pattern on the resist, one or more micromachining fabrication processes, such as Deep Reactive Ion Etching (DRIE), Wire Electric Discharge Machining (Wire EDM or WEDM), LIGA, or SCREAM (Single Crystal Reactive Etching and Metallization) may be used to etch the substrate wafer according to the masked pattern. In some applications, it is desirable to etch deep and straight sidewalls in the substrate wafer. In other applications, it is desirable to form a three-dimensional structure from the patterned wafer.

After etching, the patterned wafer is cleansed. The photoresist and/or resist may be removed using a solvent such as acetone. If there are other fragile MEMS structures on the wafer, a plasma etch may also be used to clean the substrate wafer.

Alternative manufacturing methods exist in the prior art, whereby any of the structures described herein can be manufactured using a variety of such methods, including injection molding, computer numerical control (CNC) machining, metal stamping, hot embossing, and electro-discharge-machining (EDM).

If the mounting substrate is also a semiconductor, it may be micro-machined as discussed above with regard to the MEMS substrate. Alternatively, should the mounting substrate be plastic, it may be simply be molded to form the desired features.

Embodiments described above illustrate, but do not limit, the invention. For example, mounts 400 and mounting bases 500 may be readily modified with internal flexures for pre-tensioning as discussed in U.S. Pat. No. 6,674,585. In that regard, it should be understood that numerous modifications and variations are possible in accordance with the principles of the present invention. Accordingly, the scope of the invention is defined only by the following claims.

We claim:

1. A MEMS substrate, comprising;
   a central planar portion configured to support a MEMS device;
   a first electrical pad coplanar with the central planar portion, the first electrical pad being connected to the central planar portion through a first flexure, wherein the first flexure is configured to substantially mechanically isolate the first electrical pad from the central planar portion; and
   a second electrical pad coplanar with the central planar portion, the second electrical pad being mechanically decoupled from the first electrical pad except through a second flexure connecting the second electrical pad to the central planar portion and configured to substantially mechanically isolate the second ad from the central planar portion.

2. The MEMS substrate of claim 1, wherein the central planar portion, the first electrical pad, and the first flexure comprise a micro-machined semiconductor wafer.

3. The MEMS substrate of claim 2, wherein the semiconductor wafer is a monolithic semiconductor wafer.

4. The MEMS substrate of claim 1, wherein the first and second flexures are corrugated flexures.

5. The MEMS substrate of claim 4, wherein a depth for the first and second flexures is at least ten times a width for the first and second flexures.

6. The MEMS substrate of claim 5, wherein the first flexure is configured to conduct an electrical current and the second flexure is configured to conduct the electrical current through an adjacent metal or polysilicon layer.

7. A MEMS device comprising:
   a mounting substrate having a planar surface and including a plurality of base mounts that project from the planar surface; and
   a planar MEMS substrate including a central portion and a plurality of mounts, wherein
   each mount is isolated from the central portion through one of a plurality of corresponding mount flexures,
   each mount is configured to engage with a corresponding one of the base mounts, and
   the planar MEMS substrate further includes a plurality of coplanar electrical pads, each coplanar electrical pad being mechanically isolated from the central portion and the other coplanar electrical pads except through a corresponding one of a plurality of soft flexures respectively connecting the coplanar electrical pads to the central portion.

8. The MEMS device of claim 7, wherein the plurality of base mounts comprises three base mounts, the plurality of mounts comprises three mounts, and the plurality of coplanar electrical pads comprises two coplanar electrical pads.

9. The MEMS device of claim 8, wherein each mount flexure is relatively stiff in two degrees of freedom (DOFs) but relatively less stiff in additional DOFs, and wherein each soft flexure is relatively soft in both the two DOFs and the additional DOFs.

10. The MEMS device of claim 7, wherein each mount is at a periphery of the MEMS substrate and wherein each coplanar electrical pad is also at the periphery of the MEMS substrate.

11. The MEMS device of claim 10, wherein each soft flexure is a corrugated flexure that is radially directed towards the MEMS substrate.

12. The MEMS device of claim 7, further comprising a camera module integrated onto the MEMS substrate.

13. The MEMS device of claim 12, wherein the camera module is integrated into a cell phone.

14. The MEMS device of claim 7, wherein the plurality of mount flexures corresponding to each mount comprise two tangentially-directed linear flexures.

15. The MEMS device of claim 7, further comprising wires bonded to the coplanar electrical pads.

16. The MEMS device of claim 7, wherein each mount includes a tab opening.

* * * * *